(12) United States Patent
Chhabra

(10) Patent No.: US 9,734,703 B1
(45) Date of Patent: Aug. 15, 2017

(54) SENSOR APPARATUSES AND METHODS

(71) Applicant: NXP B.V., Eindhoven (NL)

(72) Inventor: Parikshit Kumar Chhabra, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/191,095

(22) Filed: Jun. 23, 2016

(51) Int. Cl.
G08B 29/20 (2006.01)
H04B 1/00 (2006.01)
G08B 29/18 (2006.01)
H04B 17/318 (2015.01)

(52) U.S. Cl.
CPC ........... *G08B 29/20* (2013.01); *G08B 29/185* (2013.01); *H04B 1/0007* (2013.01); *H04B 17/318* (2015.01)

(58) Field of Classification Search
CPC .... G08B 29/185; G08B 29/20; H04B 17/318; H04B 1/0007; G01R 15/24; G01R 21/133; H03M 1/44; G06N 3/063; H03K 5/04
See application file for complete search history.

(56) References Cited

U.S. PATENT DOCUMENTS

| | | | |
|---|---|---|---|
| 3,979,582 A * | 9/1976 | Mims | G06G 7/06 327/552 |
| 4,212,084 A * | 7/1980 | Poole | G10K 11/345 342/373 |
| 4,804,963 A * | 2/1989 | Clapham | G01S 15/42 342/195 |
| 5,063,521 A * | 11/1991 | Peterson | G06N 3/063 365/189.15 |
| 5,585,620 A | 12/1996 | Nakamura et al. | |
| 5,764,311 A * | 6/1998 | Bonde | G06T 5/006 348/745 |
| 6,907,144 B1 | 6/2005 | Gindele | |
| 7,280,059 B1 * | 10/2007 | Tsividis | H03H 2/00 341/126 |
| 7,639,292 B2 | 12/2009 | Kwon et al. | |
| 8,125,548 B2 | 2/2012 | Hu | |
| RE44,765 E | 2/2014 | Yang et al. | |
| 9,082,075 B1 * | 7/2015 | Cruz-Albrecht | G06N 3/049 |
| 9,195,860 B1 * | 11/2015 | Patapoutian | H03H 17/02 |
| 2003/0146861 A1 * | 8/2003 | Poulton | H03M 1/1071 341/120 |
| 2003/0185576 A1 * | 10/2003 | Blake | G01R 21/133 398/202 |
| 2005/0116846 A1 * | 6/2005 | Bogner | H03M 1/109 341/118 |
| 2007/0253719 A1 * | 11/2007 | Blake | G01R 15/24 398/202 |
| 2010/0176980 A1 * | 7/2010 | Breitschadel | H03M 1/188 341/155 |

(Continued)

*Primary Examiner* — Orlando Bousono

(57) ABSTRACT

Aspects of the present disclosure are directed to sensing apparatuses and methods. As may be implemented in accordance with one or more embodiments, analog signals are obtained from a plurality of sensors and used to provide an output for particular ones of the sensors as follows. Analog signals are obtained from a particular sensor and one or more adjacent sensors. Different weighting factors are applied to the analog signals, based on the position of the sensor or sensors. The signals with the weighting factors applied thereto are combined to provide an output signal.

20 Claims, 5 Drawing Sheets

(56) References Cited

U.S. PATENT DOCUMENTS

| | | | |
|---|---|---|---|
| 2010/0225513 A1* | 9/2010 | Lin | H03M 1/0604 |
| | | | 341/120 |
| 2012/0025903 A1* | 2/2012 | Foote | H03M 1/1245 |
| | | | 327/552 |
| 2012/0232847 A1* | 9/2012 | Horton | G01C 19/5776 |
| | | | 702/189 |
| 2012/0293234 A1* | 11/2012 | Splithof | H03K 5/04 |
| | | | 327/355 |
| 2014/0062738 A1* | 3/2014 | Wu | H03M 1/0626 |
| | | | 341/118 |
| 2017/0054523 A1* | 2/2017 | Heiskanen | H04B 1/0475 |

* cited by examiner

SENSOR APPARATUSES AND METHODS

OVERVIEW

Aspects of various embodiments are directed to sensors, and to processing outputs from respective sensors as may be implemented for enhancing sensed signals.

As may be implemented in accordance with one or more embodiments, many devices employ one or more different types of sensors. These sensors can be susceptible to issues relating to noise or other conditions that can affect sensor readout. For instance, where sensors are near other circuits, such as other sensors, noise may spill over relative to each sensor. For instance, image sensors, fingerprint sensors, bar code readers and other sensors may employ two or more sensors that may be arranged in an array or a line. These sensors may be particularly susceptible to issues relating to random noise or spilling of information from one sensor to another. Such conditions may lead to undesirable sensor output, such as a noisy image or dull edges when using image sensors.

Processing sensor signals to obtain a desirable output (e.g., a value indicative of signal strength or other signal characteristics) can be achieved in a variety of manners. However, many such approaches can require undesirably high processing power, expensive circuitry and complex circuitry. These approaches may also require a relatively high amount of memory and often leads to longer latency for first data to be available.

Various embodiments are directed toward addressing these and other matters, and challenges they have presented to the manufacture and implementation of sensors, for a variety of applications.

SUMMARY

Various example embodiments are directed to issues such as those addressed above and/or others which may become apparent from the following disclosure concerning sensors and sensor readout under conditions susceptible to noise. Many such aspects involve utilizing analog-based signals to perform at least some processing aspects; it has been discovered that using such analog-based processing can enhance sensor output, address challenges such as noise and others noted above, while doing so with desirably low complexity.

In certain example embodiments, aspects of the present disclosure involve a plurality of sensors and analog circuit components coupled to obtain signals therefrom. The analog circuit components operate to combine, in one or more of a variety of manners, signals from different ones of the sensors to obtain a desirable output. This combination may be set to achieve certain desired characteristics, such as to reduce noise, enhance edges or extract other features from input data. Such approaches can be used, for example, with fingerprint sensors and other sensors in which instantaneous sensor values are obtained, such as where sampling the same sensor again won't provide much change in the sensor signal output.

In a more specific example embodiment, an apparatus includes a plurality of sensors having circuitry that generates a signal, and signal processing circuitry connected to the sensors. The signal processing circuitry operates with the sensors to, for each particular sensor, provide a sensor output as follows. An analog signal is obtained from the particular sensor, and one or more additional analog signals are obtained from one or more of the other sensors adjacent the particular sensor. Different weighting factors are applied to each of the analog signals based on the position of the sensor or sensors from which each analog signal is obtained relative to the particular sensor. This scales the analog signals. An output signal indicative of signal strength of the particular sensor (e.g., also with a desired enhancement/feature) is provided by combining the signals having the different weighting factors applied.

In another specific example embodiment, a method is carried out as follows. An analog signal is obtained for a particular sensor, and one or more additional analog signals are obtained from one or more adjacent sensors. Different weighting factors are applied to each of the analog signals based on the position of the sensor or sensors from which each analog signal is obtained relative to the particular sensor, therein scaling the analog signals. The signals having the different weighting factors applied thereto are combined to provide an output signal indicative of signal strength of the particular sensor (and, e.g., any other enhancement).

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
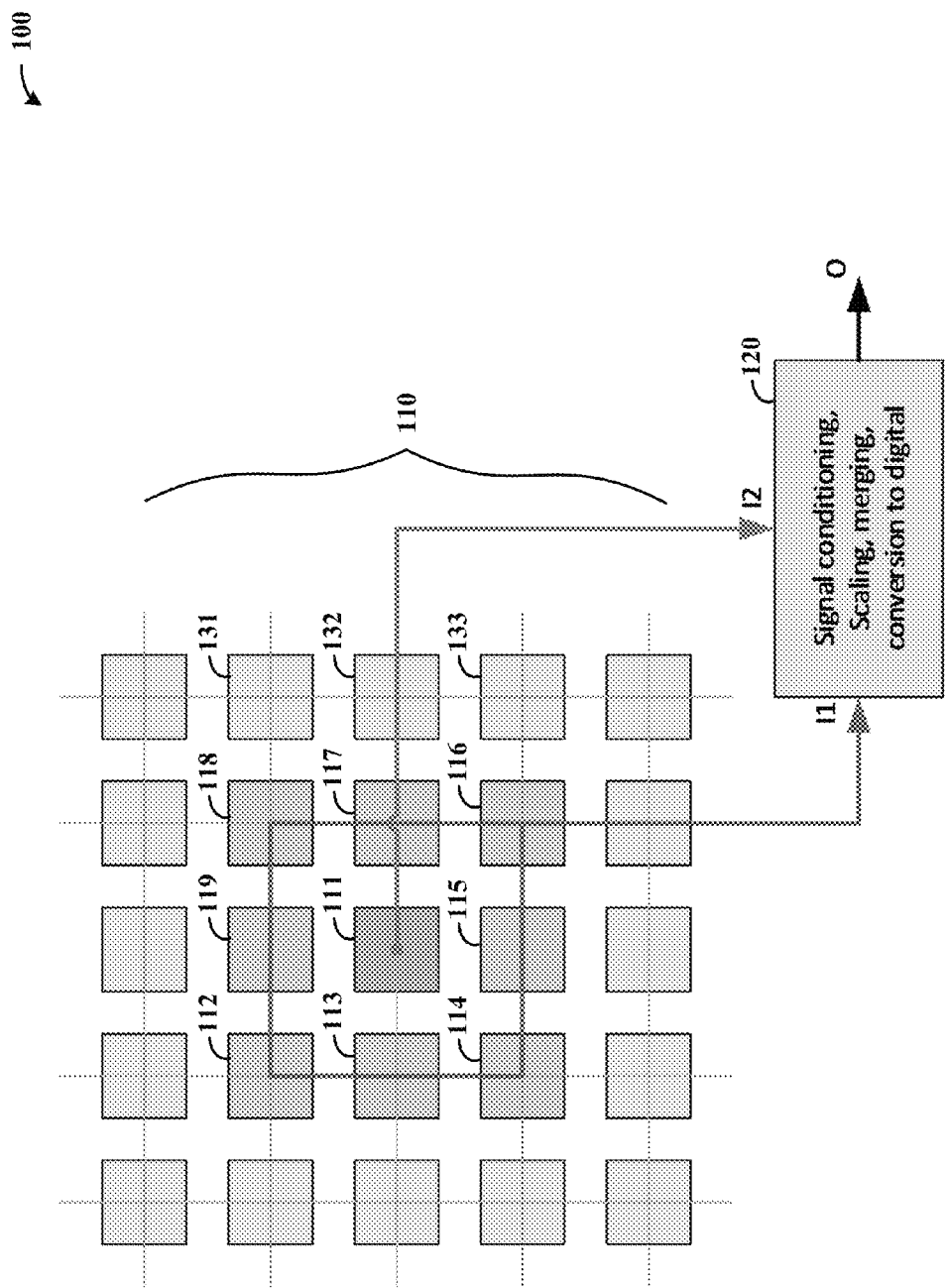
FIG. 1 shows a sensor apparatus in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving sensors. Various embodiments are directed toward a sensor architecture and readout scheme that can enhance the sensor output quality close to the sensor, leading to either no or reduced memory and processing in digital domain. One or more such embodiments may also be implemented to achieve shorter latency between sensing and making data available. In certain implementations, aspects of the present disclosure have been shown to be beneficial when used in the context of multiple sensors used in close proximity, such as in a sensor array. Various embodiments are directed to applications in which sensors are susceptible to noise or other characteristics relating to proximity to other circuitry or sensors, with such embodiments addressing these issues and/or others as characterized herein. In some embodiments, analog signals are obtained from adjacent sensors and processed in the analog domain, such as by weighting (also referred to as scaling) the analog signals based on one or more characteristics of the sensors. Such approaches can be used to achieve a desirable sensor output that addresses challenges as noted herein, while also carrying out the processing in the analog domain. These approaches may, for example, be implemented without necessarily utilizing memory or other resources, such as those that may otherwise be involved in storing and/or processing digital data. While not necessarily so limited, various aspects may be appreciated through the following discussion of non-limiting examples which use exemplary contexts.

Accordingly, in the following description various details are set forth to describe examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination. For instance, fewer or additional sensors may be utilized, in an overall structure and/or in respective processing approaches where less than all sensors are used.

Various embodiments are directed to mitigating the creation of objectionable artifacts, utilizing analog-based sensor output processing, without necessarily using line-memories and one or both of a digital signal processor (DSP), application specific integrated circuit (ASIC) and/or general purpose CPU to process sensor data. Such embodiments can mitigate power consumption of such componentry as well as related latency of operation of such circuitry.

Various embodiments are directed to sensing applications involving taking an instantaneous sensor signal value, or a few such signal values. This approach can be used for fingerprint sensing, photo-sensing, capacitive sensing, resistive change sensing, pressure sensing or other transducer-based sensing in which an analog signal is obtained. In certain embodiments, fingerprint sensors are read out in accordance with one or more embodiments. Capacitive sensing can be implemented to obtain instantaneous sensor readout, which can then be processed to provide a characterization of a fingerprint on a finger sensed capacitively.

In certain image-based applications, analog signals from a primary pixel/pixel to be read-out and some or all of its neighbors are adjusted using scaling factors, and combined either in the analog domain or in the digital domain, such as immediately after analog-digital conversion to achieve desired image enhancement effect. In certain embodiments where image sensors are used, neighboring pixels are reset after respective readouts to mitigate smearing.

One or more neighboring sensor outputs can be combined via addition, subtraction and/or scaling. Neighboring sensor outputs are selected to achieve a specific effect. In some embodiments, neighboring outputs are added for noise filtering. In other embodiments, edge enhancement is achieved by adding and/or subtracting a scaled-down value of some or all of neighboring sensors after applying an optional scaling factor to the sensor for which an output is achieved.

Various embodiments are directed to obtaining a signal for a single sensor, by reading sensor outputs of the single sensor along with outputs of adjacent sensors, with two or more of the sensors being read as a combined signal output. Adjacent in this context includes being directly/indirectly adjacent so long as the proximity is sufficiently close that information from the adjacent sensor provides some insight as to effects upon the sensor of interest. Accordingly, for many embodiments an adjacent sensor is physically located, often but not limited to, within radius of four to five sensors around the particular sensor of interest. Sensor output values (or signals) are scaled and merged in desired manner before providing them to digital signal processor or other logic. The scaling and merging may perform a function similar to what is done in digital signal processing, such as for edge enhancement. In some embodiments, sensor outputs from a plurality of sensors surrounding a sensor of interest are combined and used together with an output from the sensor of interest to generate a refined output characterizing the sensor of interest.

Sensors that are read together may or may not involve simultaneous readout of such sensors and a sensor of interest for which a resulting signal is generated. For instance, resources such as amplifiers, ADCs and others can be shared, with two or more readings carried out at different times. For instance, a sensor of interest can be read out first, followed by a combined readout of neighboring sensors. In another example, a first set of neighboring sensors are read out, followed by a sensor of interest, and followed further by a second set of neighboring sensors. This provides temporally-aligned readouts characterizing the sensor of interest as well as adjacent sensors. In certain embodiments, the first and second sets of neighboring pixels are the same and the results are combined to provide a balance with timing before and after readout of the sensor of interest.

Other embodiments employ two or more pipelines of readout circuitry. For instance, one set of circuitry may be implemented to read out a sensor of interest while another set of circuitry is employed to read out neighboring sensors, with outputs of the respective sets being combined in a manner as desired for generating an output characterizing the sensor of interest.

In some embodiments, an analog readout approach as characterized herein is carried out for reading out sensors in an array row by row, sequentially reading out the columns and processing the horizontal rows in the digital domain. Various such combinations of analog and digital readout/processing can be carried out.

The following graphical tables show respective readout schemes for sensors arranged in a 3×3 array, with respective weighting factors shown as assigned to sensors in the indicated locations within the array. In this context, Table 1 shows a weighting approach as can be implemented as an edge enhancement filter, Table 2 shows a weighted neighbor merging approach, and Table 3 shows a weighting approach for previous-line and next-line weighting, as can be implemented in accordance with various embodiments. By way of example, with the center sensor being a sensor of interest, a positive weighting factor is applied to it as shown for each scheme. Surrounding sensors along the edges of each graphical table, adjacent the center sensor as shown, are weighted with a negative value. Other embodiments involve applying one or more positive values to sensors adjacent the sensor of interest, and still other embodiments involve using additional neighboring sensors. By way of example, adjacent sensors are weighted equally in Table 1. In Table 2, adjacent sensors sharing a full boundary with the center sensor horizontally and vertically are weighted with a higher negative value, whereas corner sensors are weighted with a lower negative value. In Table 3, sensors in the same row as the center sensor are not used, with previous (upper) and following (lower) rows of sensors being weighted equally (negative).

TABLE 1

| −1 | −1 | −1 |
|---|---|---|
| −1 | +8 | −1 |
| −1 | −1 | −1 |

TABLE 2

| −1 | −2 | −1 |
|---|---|---|
| −2 | +12 | −2 |
| −1 | −2 | −1 |

TABLE 3

| −1 | −1 | −1 |
|---|---|---|
|    | +6 |    |
| −1 | −1 | −1 |

As may be implemented in various embodiments, the weighting approach shown in Table 4 below is implemented with addition, corresponding to adjacent sensors. Such an approach can be used to obtain a horizontal derivative, and uses negative as well as positive scaling factors for adjacent sensors with the sensor of interest scaled by 0 (i.e., not added at all). Such a filter can be used in image processing, with scaling in the analog domain. In various embodiments the sensor of interest may also be given weight.

TABLE 4

| −1 |   | +1 |
|---|---|---|
| −2 | 0 | +2 |
| −1 |   | +1 |

The following example in Table 5 provides filtering for edge detection, in accordance with one or more embodiments. In this context, the adjacent sensors used extend out in a 5×5 array, with the indicated sensors being utilized with weighting factors as shown. Other embodiments use additional sensors, such as in an 11×11 array.

TABLE 5

|    |    |    | −1 |    |    |    |
|---|---|---|---|---|---|---|
|    |    | −1 | −2 | −1 |    |    |
|    | −1 | −2 | 16 | −2 | −1 |    |
|    |    | −1 | −2 | −1 |    |    |
|    |    |    | −1 |    |    |    |

In a more specific example embodiment, an apparatus includes a plurality of sensors having circuitry that generates a signal, and signal processing circuitry connected to the sensors. The signal processing circuitry operates with the sensors to, for each particular sensor, provide a sensor output as follows. An analog signal is obtained from the particular sensor, and one or more additional analog signals are obtained from one or more of the other sensors adjacent the particular sensor. Different weighting factors are respectively applied to each of the analog signals based on the position of the sensor or sensors from which each analog signal is obtained relative to the particular sensor. This may involve, for instance, applying a weighting factor to one of the analog signals, and applying a different weighting factor to another one of the analog signals. This scales the analog signals. An output signal indicative of signal strength of the particular sensor is provided by combining the signals having the different weighting factors applied (e.g., based on location of the at least another one of the sensors relative to the particular sensor).

In various implementations, an enhancement is achieved, such as for mitigating noise, by applying the different weighting factors to each of the analog signals and combining the scaled analog signals in the analog domain, therein utilizing the analog domain to provide the output signal as an enhanced signal (e.g., a denoised signal). Such an approach may be desirable, for example, to apply an enhancement such as reducing noise in a manner that does not require digital processing circuitry, which may be expensive and complex. Various approaches to weighting and combining (including selecting which adjacent sensor outputs to combine) can be carried out to effect analog denoising in this context, achieving different results.

In a more particular embodiment, the signal processing circuitry provides the sensor output as above, with the following modifications in the approach as pertains to different signals obtained from adjacent sensors. The step involving obtaining one or more analog signals from other ones of the sensors includes obtaining different analog signals from outputs of different ones of the other ones of the sensors. The step involving applying the different weighting factors includes applying different weighting factors to each of the different analog signals. Accordingly, different weighting factors can be applied to different sensor outputs, providing more or less weight to the outputs based on the sensors from which the outputs are obtained.

In another more particular embodiment, the following modifications are effected for the indicated steps above. The step of obtaining the at least one analog signal from other ones of the sensors is carried out by obtaining different analog signals from different sets of the other ones of the sensors, in which each different analog signal is obtained from outputs of all sensors in one of the sets. The step of applying the different weighting factors includes applying different weighting factors to the analog signal obtained for each set of the other ones of the sensors.

Once the analog signals are weighted, signals from the particular sensor of interest and from one or more adjacent sensors are added in either the analog or digital domain. In some embodiments involving analog domain addition, the signal processing circuitry includes one or more scaling circuits and an adder circuit, such as an analog adder circuit. Each scaling circuit is connected to receive an output of one or more of the sensors and scales the analog signal output from the one or more of the sensors. The adder circuit generates the output signal as an analog output signal by adding an analog output of each of the at least two scaling circuits, which may include adding a negative (subtracting) the outputs. The scaling circuit(s) may, for example, include two scaling circuits respectively operable to scale the analog signal output(s) by applying a non-unitary scaling factor to the received output.

In some embodiments involving a digital adder, the signal processing circuitry includes at least two scaling circuits that are each connected to receive an output of one or more of the sensors and that apply a scaling factor to the received output. A digitizing circuit converts an analog output of each of the at least two scaling circuits to respective digital signals, and an adder circuit generates the output signal by adding the respective digital signals.

The signals may be combined in a variety of manners. For instance, the combination can be carried out to achieve a resulting effect, such as by enhancing a signal to extract features (e.g., edges, shapes), upon the generated output and related contextual image (or other sensed aspect). Such effects may include, for example, edge enhancement and/or noise filtering for images.

The signal processing circuitry can be implemented in a variety of manners. In some embodiments, the circuitry includes two or more input ports connected to receive the analog signals from different ones of the plurality of sensors. These ports may be coupled to the sensors using one or more of a variety of approaches, such as with a grid of connectors that are selectively accessed to obtain signals from particular ones of the sensors, or a particular set of sensors. An analog scaling circuit can be used to apply weighting as follows. A first one of the input ports is electrically connected to the analog scaling circuit, which multiplies a first one of the analog signals by a first weighting factor, and a result of the multiplying is stored as a first scaled analog signal. A second one of the input ports is electrically connected to the analog scaling circuit, which multiplies a second one of the analog signals by a second weighting factor, with the result being provided as a second scaled analog signal. The first and second scaled analog signals can then be combined and provided as an output.

The weighting factors can be applied in a variety of manners. In some embodiments, weighting factors are sequentially applied to respective ones of the analog signals in a common scaling circuit. This can involve a temporal approach in which a single scaling circuit can process a first analog signal, and later process a second analog signal, with each signal later being combined as sequentially presented at an output of the common scaling circuit. This facilitates use of a single circuit to carry out the processing, which can save cost and complexity.

The sensors are arranged in a variety of manners, to suit particular applications. For instance, sensors can be arranged in a row, in a grid or matrix, or generally relative to one another. In some embodiments involving sensors arranged in an array having rows and columns, analog and digital processing is utilized for different ones of the sensors. In a particular implementation, weighting factors are applied to analog signals obtained from respective columns of the sensors in the analog domain. Signals obtained from respective rows of the sensors are converted from the analog domain to the digital domain, and second weighting factors are applied to those signals in the digital domain. The signals weighted in the analog domain can then be converted to the digital domain, in which further processing can be carried out (e.g., adding/subtracting).

Various methods may be implemented in accordance with the discussion herein concerning apparatuses. In some embodiments, an analog signal is obtained for a particular sensor, and one or more additional analog signals are obtained from one or more adjacent sensors. Different weighting factors are applied to each of the analog signals based on the position of the sensor or sensors from which each analog signal is obtained relative to the particular sensor, therein scaling the analog signals. This may involve, for example, applying a weighting factor to the particular sensor of interest and applying a different weighting factor (or different weighting factors) to other ones of the sensors. The signals having the different weighting factors applied thereto are combined to provide an output signal indicative of signal strength of the particular sensor. In various implementations, an enhancement is achieved by applying the weighting factors and combining the scaled analog signals in the analog domain, therein utilizing the analog domain to provide the output signal as an enhanced signal.

Different analog signals can be obtained from outputs of different ones of the other sensors, and the different weighting factors can be applied to each of the signals. Similarly, different signals can be obtained from different sets of sensors, such as sets pertaining to positions of the sensors relative to the particular sensor of interest for which an output is generated. The signals can be obtained from outputs of all sensors in each set, and different weighting factors can be applied to the analog signal obtained for each set of the other ones of the sensors.

Turning now to the figures, FIG. 1 shows a sensor apparatus 100 in accordance with the present disclosure. The apparatus 100 includes a sensor array 110 and readout circuitry block 120. By way of example, sensors 111, 112, 113, 114, 115, 116, 117, 118 and 119 are shown as being read out. Center sensor 111 is thus surrounded by sensors 112, 113, 114, 115, 116, 117, 118 and 119, with the surrounding sensors connected to readout circuitry block 120 via input I1, and with the center sensor 111 being connected to the readout circuitry via input I2. In this instance, signals from each of the surrounding sensors are collected together such that the input at I1 is a combination of these signals.

The readout circuitry block 120 can apply weighting factors to the respective signals received at inputs I1 and I2. In this context (and with the surrounding sensors 112, 113, 114, 115, 116, 117, 118 and 119 coupled as shown), a common weighting factor is applied to the collective output from all surrounding sensors, and a different weighting factor can be applied to the center sensor 111. These weighting factors are applied to analog signals collected from the respective inputs at I1 and I2, and the signals may be further operated upon such as by combining them in the analog domain, combining them in the digital domain, or carrying out other operations. By way of example, FIG. 1 shows exemplary operations including signal conditioning, scaling, merging, and conversion from analog to digital. After performing these operations, the readout circuitry block 120 provides an output "O" that characterizes the center sensor 111.

The readout circuitry block 120 may subsequently be coupled to different ones of the sensors in the sensor array 110, such as by utilizing one of the other sensors as a "new" center sensor and other adjacent sensors in the context of the above. For instance, with sensor 117 utilized as a center sensor, sensors 111, 115, 116, 118, 119, 131, 132 and 133 are utilized as surrounding sensors. Similar readout can be performed. Readout approaches as shown in Table 1, Table 2, and/or Table 3 can be carried out using such sensor arrays. In addition, the readout circuitry can be implemented to collect sensor outputs using a single input, such as by collecting a center sensor signal first, then collecting signals from one or more surrounding sensors, and processing the signals accordingly.

Figure 2:
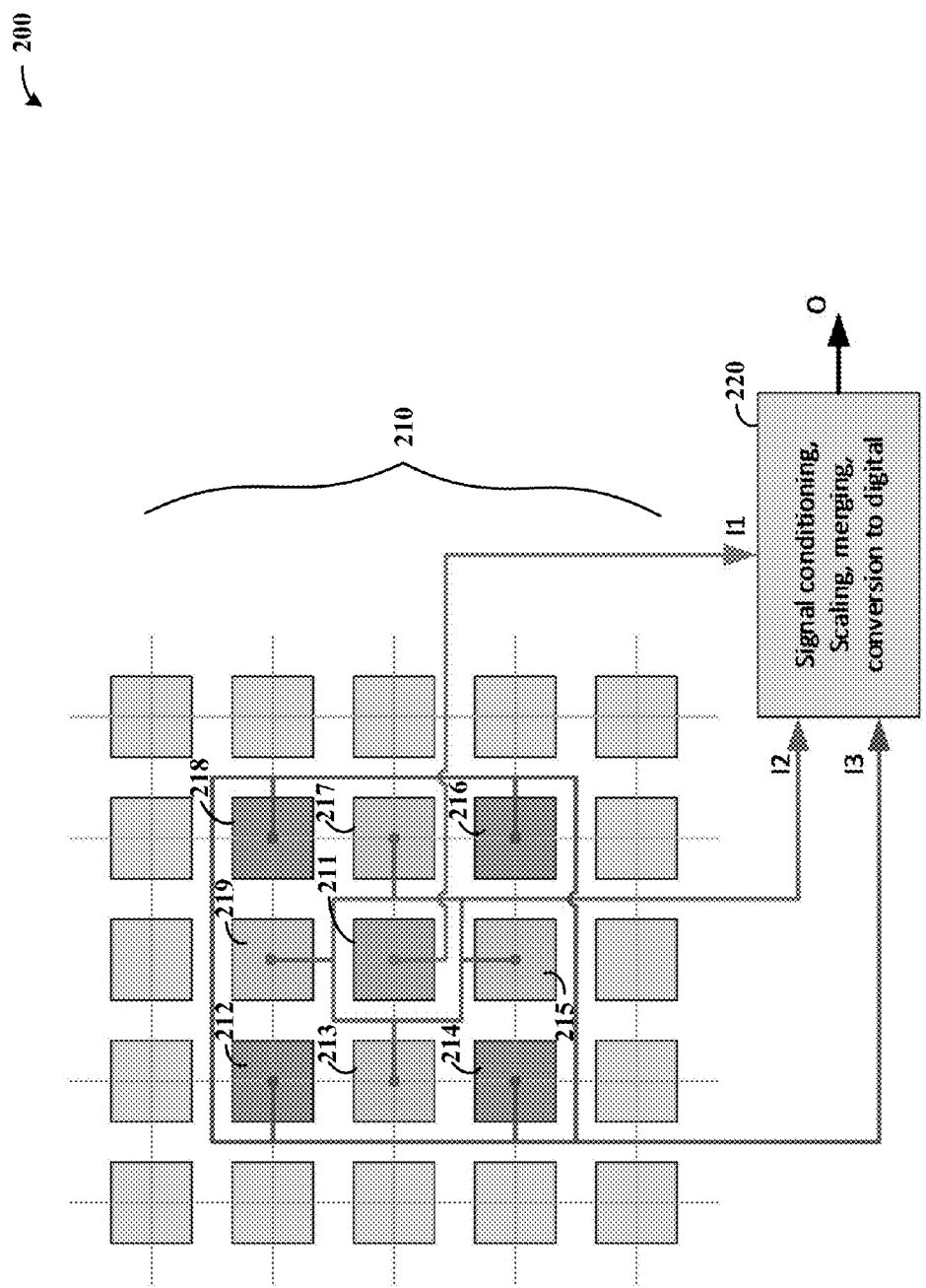
FIG. 2 shows another sensor apparatus in accordance with the present disclosure.

FIG. 2 shows another sensor apparatus 200, in accordance with the present disclosure. The sensor apparatus 200 is shown implemented with a relatively more complex signal processing approach, using "n" different weighing factors in which "n" branches from the sensor array are processed accordingly. The sensor apparatus 200 includes a sensor array 210 and readout circuitry block 220. By way of example, sensors 211, 212, 213, 214, 215, 216, 217, 218 and 219 are shown as being read out. Center sensor 211 is connected to readout circuitry block 220 via input I1, vertically-adjacent sensors 215 and 219 as well as and horizontally-adjacent sensors 213 and 217 are read out together via input I2, and corner-sensors 212, 214, 216 and 218 are read out together via input I3.

The readout circuitry block 120 can apply weighting factors to the respective signals received at inputs I1, I2 and I3. In this context, a common weighting factor is applied to the collective output from sensors read at the respective inputs. As such, vertically-adjacent sensors 215 and 219 as well as and horizontally-adjacent sensors 213 and 217 are weighted similarly, corner-sensors 212, 214, 216 and 218 are also weighted similarly, and different weighting factors can be applied to each collective group of sensors read at respective inputs. As with the examples above, these weighting factors are applied to analog signals collected from the respective inputs and the signals may be further operated upon such as by combining them in the analog domain, combining them in the digital domain, or carrying out operations such as signal conditioning, scaling, merging, and conversion from analog to digital. After performing these operations, the readout circuitry block 220 provides an output "O" that characterizes the center sensor 211.

Figure 3:
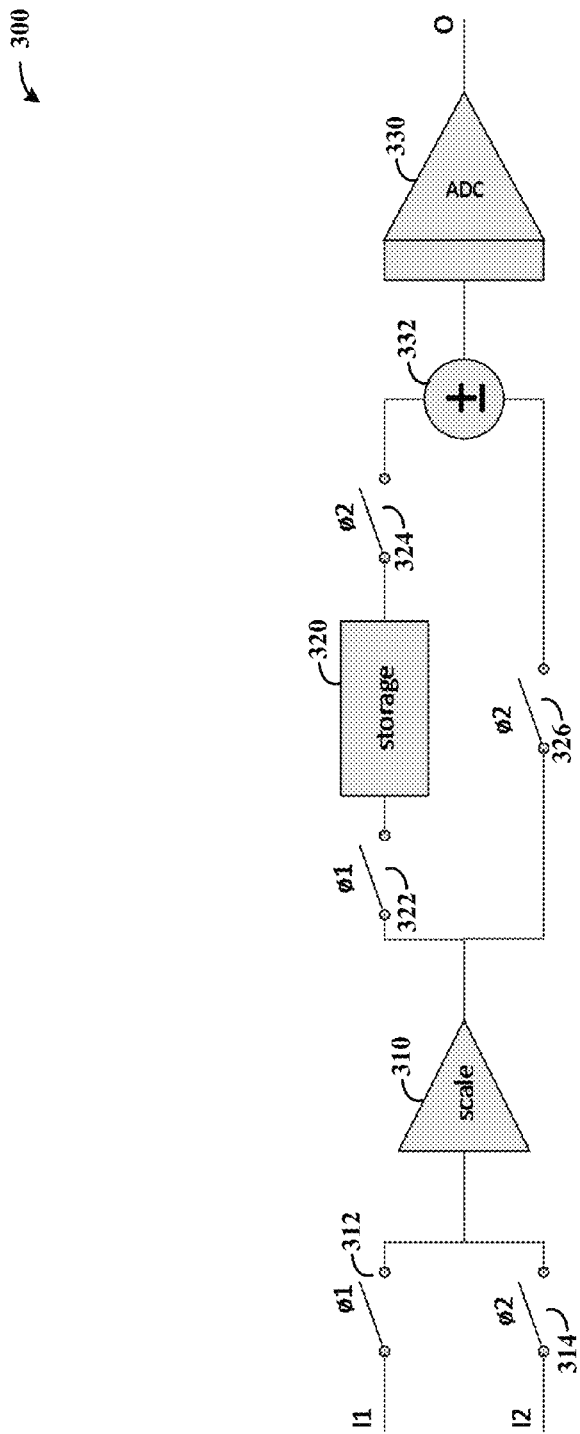
FIG. 3 shows an apparatus, as may be implemented with one or more aspects of the present disclosure.
Figure 4:
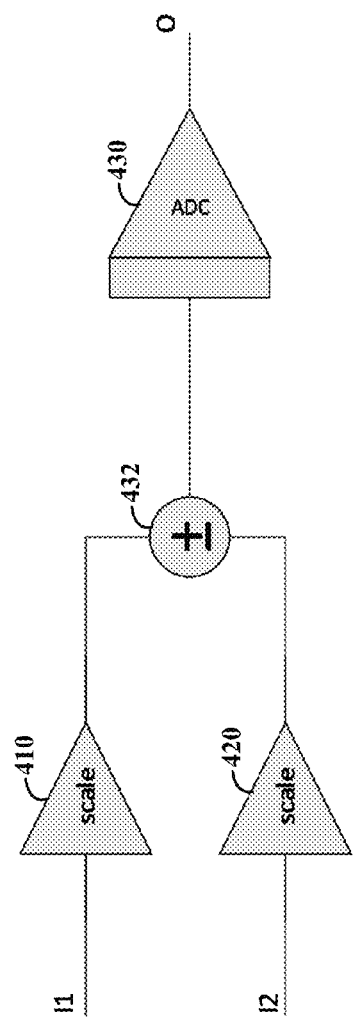
FIG. 4 shows another apparatus, as may be implemented with one or more aspects of the present disclosure.
Figure 5:
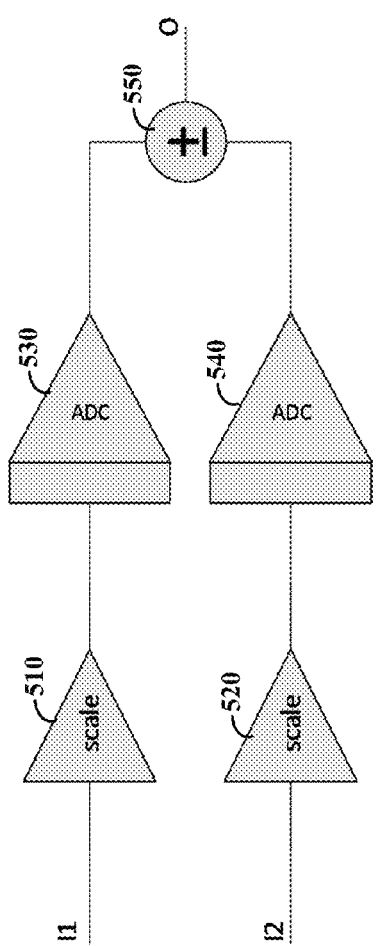
FIG. 5 shows another apparatus as may be implemented with one or more aspects of the present disclosure.

FIGS. 3-5 show exemplary configurations of data pipeline architectures, as may be implemented with one or more embodiments. These and other configurations may be set based on a chosen architecture and sampling. Beginning with FIG. 3, an apparatus 300 is implemented with one or more aspects of the present disclosure. The apparatus 300 includes a scaling circuit 310 coupled to selectively receive inputs I1 and I2. An output of the scaling circuit 310 is provided as shown to a storage circuit 320 and/or to an adder circuit 332. An output of the adder circuit 332 is coupled to an ADC converter 330.

The apparatus 300 can be implemented, for example, within the readout circuitry block 120 or 220 of FIGS. 1 and 2. Switches 312 and 314 are respectively coupled to each of the inputs I1 and I2, for temporally processing analog signals received on these inputs via scaling circuit 310. This approach facilitates using a single scaling circuit to apply weighting factors to different input signals. Switches 322/324 selectively couple storage circuit 320 to the output of the scaling circuit 310 and adder 332, and switch 326 selectively couples the output of the adder circuit 332 directly to the adder circuit 332. In this context, a first signal (e.g., obtained from input I1) can be stored at the storage circuit 320 via switch 322 (with switch 324 open). A second signal (e.g., obtained from input I2) can be then weighted and presented directly to the adder circuit 332 via switch 326 along with the stored signal at storage circuit 320 (via switch 324 with switch 322 open).

FIG. 4 shows another apparatus 400, as may be implemented with one or more aspects of the present disclosure (e.g., for data pipeline/scaling approaches). The apparatus 400 includes scaling circuits 410 and 420 each directly connected to inputs I1 and I2, such as may be implemented with one or both of the approaches shown in FIGS. 1 and 2. In this instance, each input has a dedicated scaling circuit. The outputs of the scaling circuits 410 and 420 are connected to adder circuit 432, which combines the signals and presents them to ADC 430, which generates a digital output signal "O" that represents the value of a sensor of interest.

FIG. 5 shows another apparatus 500 as may be implemented with one or more aspects of the present disclosure. The apparatus 500 is similar to the apparatus in FIG. 4, with adding functions being carried out in the digital domain. Scaling circuits 510 and 520 are directly connected to inputs I1 and I2, and as such may be implemented with one or both of the approaches shown in FIGS. 1 and 2. As with the instance shown in FIG. 4, each input has a dedicated scaling circuit. The outputs of the scaling circuits 510 and 520 are respectively connected to ADC 530 and ADC 540 which respectively convert the scaled analog signals to the digital domain. Adder 550 adds the signals in the digital domain, and provides a digital output signal "O" that represents the value of a sensor of interest.

Terms to exemplify orientation, such as upper/lower, left/right, top/bottom horizontal/vertical and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the specification (including claims) connote a plain meaning in the art unless otherwise indicated. As examples, the specification describes and/or illustrates aspects useful for implementing the claimed disclosure by way of various circuits or circuitry which may be illustrated as or using terms such as blocks, modules, device, system, unit, controller, clamp and/or other circuit-type depictions (e.g., reference numeral 120 of FIG. 1, 220 of FIG. 2, 310, 320, 330 or 332 of FIG. 3, or those in other figures may depict a block/module in this context). Such circuits or circuitry are used together with other elements to exemplify how certain embodiments may be carried out in the form or structures, steps, functions, operations, activities, etc. As another example, where the specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to scale . . . " is interpreted as "circuit configured to scale . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. The respective sensors and processing circuitry may be formed in different devices or with different arrangements to achieve a particular effect. As another example, different types of sensors and scaling or adding (subtracting) circuitry can be utilized with sensors and related componentry that enhances sensor data processing. Such modifications do not depart from the true spirit and scope of various aspects of the disclosure, including aspects set forth in the claims.

What is claimed is:

1. An apparatus comprising:
   a plurality of sensors, each including circuitry configured and arranged to generate a signal;
   signal processing circuitry connected to the sensors, the signal processing circuitry being configured and arranged with the sensors to, for each particular sensor, provide a sensor output by:
   obtaining an analog signal from the particular sensor;
   obtaining at least one analog signal from at least another one of the sensors adjacent the particular sensor;
   applying different weighting factors to the analog signals based on the position of the sensor or sensors from which the analog signals are obtained relative to the particular sensor, therein scaling the analog signals; and
   generating an output signal indicative of signal strength of the particular sensor by combining the signals having the different weighting factors applied thereto.

2. The apparatus of claim 1, wherein
   applying the different weighting factors to the analog signals and combining the signals includes at least one of: conditioning or enhancing the signals, processing the signals by mitigating or filtering noise; and processing the signals, and
   the signals are treated by applying the weighting factors and combining the scaled analog signals in the analog domain, therein utilizing the analog domain to provide the output signal.

3. The apparatus of claim 1, wherein:
   obtaining the at least one analog signal from other ones of the sensors includes obtaining different analog signals from outputs of different ones of the other ones of the sensors, and
   applying the different weighting factors includes respectively applying different weighting factors to each of the different analog signals.

4. The apparatus of claim 1, wherein
   obtaining the at least one analog signal from other ones of the sensors includes obtaining different analog signals from different sets of the other ones of the sensors, each different analog signal being obtained from outputs of all sensors in one of the sets, and
   applying the different weighting factors includes applying different weighting factors to the analog signal obtained for each set of the other ones of the sensors.

5. The apparatus of claim 1, wherein the signal processing circuitry includes
   at least one scaling circuit, each scaling circuit being connected to receive an output of one or more of the sensors and configured and arranged to scale the analog signal output from the one or more of the sensors by applying a scaling factor to the received output, and
   an adder circuit configured and arranged to generate the output signal as an analog output signal by adding analog outputs of the at least one scaling circuit.

6. The apparatus of claim 5, wherein the at least one scaling circuit includes at least two scaling circuits, each scaling circuit being configured and arranged to scale the analog signal output of the one or more of the sensors by applying a non-unitary scaling factor to the received output.

7. The apparatus of claim 5, wherein adding an analog outputs of the at least one scaling circuit includes adding a negative of a particular one of the analog outputs, therein subtracting the particular one of the analog outputs.

8. The apparatus of claim 1, wherein the signal processing circuitry includes
   at least two scaling circuits, each scaling circuit being connected to receive an output of one or more of the sensors and configured and arranged to apply one of the different weighting factors by applying a scaling factor to the received output,
   a digitizing circuit configured and arranged to convert an analog output of each of the at least two scaling circuits to respective digital signals, or to convert a combined analog output of the at least two scaling circuits to a digital signal, and
   an adder circuit configured and arranged to generate the output signal by adding an the respective digital signals.

9. The apparatus of claim 1, wherein combining the signals having the different weighting factors applied thereto includes combining the signals based on location of the at least another one of the sensors relative to the particular sensor.

10. The apparatus of claim 1, wherein combining the signals having the different weighting factors applied thereto includes combining the signals based on an effect to be applied to an image generated using the signals.

11. The apparatus of claim 1, wherein the signal processing circuitry includes at least two input ports connected to receive the analog signals from different ones of the plurality of sensors, and wherein applying different weighting factors to each of the analog signals includes, using an analog scaling circuit,
    coupling a first one of the input ports to the analog scaling circuit, multiplying a first one of the analog signals presented at the first one of the input ports by a first weighting factor, and storing a result of the multiplying as a first scaled analog signal, and
    coupling a second one of the input ports to the analog scaling circuit, and multiplying a second one of the analog signals presented at the second one of the input ports by a second weighting factor, and providing a result of the multiplying as a second scaled analog signal.

12. The apparatus of claim 11, wherein generating the output signal includes combining the first scaled analog signal and the second scaled analog signal.

13. The apparatus of claim 1, wherein
    applying different weighting factors includes sequentially applying weighting factors to respective ones of the analog signals in a common scaling circuit, and
    combining the signals having the different weighting factors applied thereto includes combining the signals with the different weighting factors applied thereto as sequentially presented at an output of the common scaling circuit.

14. The apparatus of claim 1, wherein the plurality of sensors are arranged in an array having rows and columns, and wherein applying the different weighting factors includes:
    applying first weighting factors to analog signals obtained from respective columns of the sensors, and
    converting signals obtained from respective rows of the sensors from the analog domain to the digital domain, and applying second weighting factors to the signals in the digital domain.

15. The apparatus of claim 14, wherein generating the output signal includes:

converting the analog signals, obtained from respective columns of the sensors with the first weighting factors applied thereto, from the analog domain to the digital domain, and combining the digital signals obtained from respective columns of the sensors with the digital signals obtained from respective rows of the sensors with the second weighting factors applied thereto.

16. A method comprising:

obtaining an analog signal from a particular sensor of a plurality of sensors that generate analog signals;

obtaining at least one analog signal from at least another one of the plurality of sensors adjacent the particular sensor;

applying different weighting factors to the analog signals based on the position of the sensor or sensors from which the analog signals are obtained relative to the particular sensor, therein scaling the analog signals; and generating an output signal indicative of signal strength of the particular sensor by combining the signals having the different weighting factors applied thereto.

17. The method of claim 16, wherein the steps of applying the different weighting factors and generating the output signal are carried out in signal processing circuitry connected to the plurality of sensors.

18. The method of claim 16, wherein applying the different weighting factors to the analog signals and combining the signals includes applying the weighting factors and combining the scaled analog signals in the analog domain, therein utilizing the analog domain to provide the output signal as an enhanced or conditioned signal.

19. The method of claim 16, wherein:

obtaining the at least one analog signal includes obtaining different analog signals from outputs of different ones of the other ones of the sensors, and applying the different weighting factors includes respectively applying different weighting factors to each of the different analog signals.

20. The method of claim 16, wherein obtaining the at least one analog signal includes obtaining different analog signals from different sets of the other ones of the sensors, each different analog signal being obtained from outputs of all sensors in one of the sets, and applying the different weighting factors includes respectively applying different weighting factors to the analog signal obtained for each set of the other ones of the sensors.

* * * * *